(12) United States Patent
Lin

(10) Patent No.: US 6,926,932 B2
(45) Date of Patent: Aug. 9, 2005

(54) METHOD FOR FORMING SILICON OXIDE LAYER

(75) Inventor: Hui-Chu Lin, Hsinchu (TW)

(73) Assignee: Toppoly Optoelectronics Corp., Miaoli (TW)

(*) Notice: Subject to any disclaimer, the term of this patent is extended or adjusted under 35 U.S.C. 154(b) by 46 days.

(21) Appl. No.: 10/448,877

(22) Filed: May 30, 2003

(65) Prior Publication Data

US 2004/0241341 A1 Dec. 2, 2004

(51) Int. Cl.$^7$ ................................................ H05H 1/00
(52) U.S. Cl. .................. 427/539; 427/255.27; 427/578
(58) Field of Search ................. 427/255.26, 255.27, 427/578, 535

(56) References Cited

U.S. PATENT DOCUMENTS 5,654,203 A * 8/1997 Ohtani et al. ............... 438/97
5,691,212 A * 11/1997 Tsai et al. .................. 438/297
5,989,945 A * 11/1999 Yudasaka et al. ........... 438/149
6,230,650 B1 * 5/2001 Yamazaki ............. 118/723 ME
6,291,837 B1 * 9/2001 Nakajima et al. ............ 257/57
6,294,219 B1 * 9/2001 Tsai et al. .................. 427/314
6,338,874 B1 * 1/2002 Law et al. ............. 427/255.18
6,358,785 B1 * 3/2002 Chittipeddi et al. ........ 438/174

* cited by examiner

Primary Examiner—Bret Chen
(74) Attorney, Agent, or Firm—Tracy M Heims; Apex Juris, PLLC

(57) ABSTRACT

A method for forming a silicon oxide layer in the production of the polysilicon film transistor is disclosed. A plasma surface treatment is performed over a substrate after an amorphous silicon layer has been formed on the substrate by PECVD to transform a portion of the amorphous silicon layer into a superficial oxide layer.

8 Claims, 1 Drawing Sheet

METHOD FOR FORMING SILICON OXIDE LAYER

BACKGROUND OF THE INVENTION

1. Field of Invention

The invention relates to a method for forming a silicon oxide layer, more particularly to a method for forming a silicon oxide layer in the production of polysilicon film transistors.

2. Related Art

Mechanical, electronic and semiconductor industries usually include the formation of a material layer with certain properties over its components. The layer is usually deposited at the atomic or molecular level, which has a structure that cannot be obtained by thermal equilibrium.

Conventionally, a film deposition process may be performed through a physical vapor deposition (PVD) or a chemical vapor deposition (CVD) according to the participation of a chemical reaction mechanism. The deposited layer may have a monocrystalline, polycrystalline or amorphous structure, depending upon the conditions of deposition. The characteristics of the deposited layer can be useful in various fields. For example, a buffer layer and a precursor layer are commonly used in the production of low-temperature polysilicon film transistors. The precursor layer is created by through forming an amorphous silicon layer on a substrate, and then raising the temperature of the amorphous silicon layer to its melting point by excimer laser annealing (ELA). As the amorphous silicon layer is subjected to the energy of the excimer laser wavelength, it starts melting and becomes a polysilicon structure. Before excimer laser annealing, the formation of a silicon oxide layer over the amorphous silicon layer is usually needed. Therefore, the substrate with the amorphous silicon layer thereon has to be transferred into a cleaner to form the silicon oxide layer over the amorphous layer by rinsing in an ozone aqueous solution.

A plasma-enhanced chemical vapor deposition (PECVD) has the advantages of being performed in lower temperature conditions with a high deposition rate and good step coverage. The current production process of low-temperature polysilicon performs the PECVD on the substrate to deposit a spacer layer and an amorphous layer. After the amorphous silicon layer is formed, the substrate is subject to oxidation, which easily causes contamination and increases the production time.

SUMMARY OF THE INVENTION

An object of the invention is therefore to provide a method for forming a silicon oxide layer in the production of a polysilicon film transistor. After an amorphous silicon layer has been formed on a provided substrate, a surface treatment using oxygen-containing plasma is performed on the substrate to transform a part of the amorphous silicon layer to a superficial oxide layer.

The formation of the silicon oxide layer is integrated with the film deposition by EPCVD, while transferring the substrate for performing additional processing. In the process of the invention, after the EPVCD has been performed on the substrate to deposit the amorphous silicon, a plasma surface treatment using oxygen-containing source is performed on the amorphous silicon layer to transform a portion of the amorphous silicon layer to the superficial oxide layer. Then, the treated substrate is subject to a subsequent forming process, for example, a gate, source and drain of the transistor. The remaining amorphous silicon layer is finally subject to excimer laser annealing to form a polysilicon layer. Thereby, the process of forming the polysilicon silicon layer is more economical and less time-consuming. Furthermore, the transformation of a part of the amorphous silicon layer to the superficial oxide layer by plasma requires no heat on the substrate. Therefore, the material property of the substrate is not deteriorated.

Further scope of applicability of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more clearly understood from the detailed description hereafter in reference to the drawing, provided only for the purpose of illustration, and thus should not be construed in a limitative way, wherein.

DETAILED DESCRIPTION OF THE INVENTION

Figure 1:
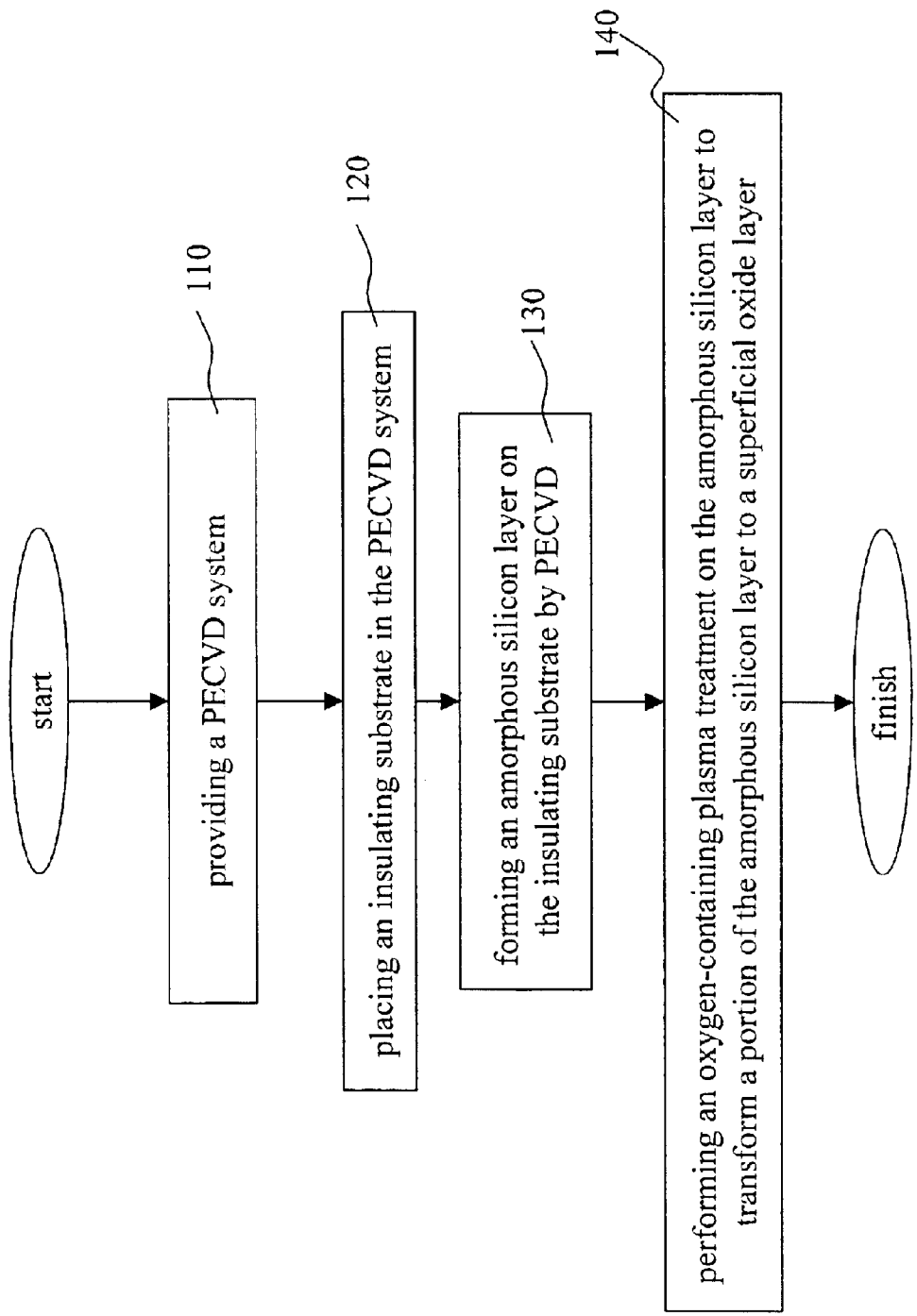
FIG. 1 is a flow chart of the method for forming an amorphous silicon layer according to one embodiment of the invention.

The invention provides a method for forming a silicon oxide layer in the production of a polysilicon film transistor. FIG. 1 is a flow chart illustrating the method for forming an amorphous layer according to one embodiment of the invention. The process of the invention includes the steps of: providing a PECVD system (step 110); placing an insulating substrate in the PECVD system (step 120); forming an amorphous silicon layer on the insulating substrate by PECVD (step 130); and performing an oxygen-containing plasma treatment on the amorphous silicon layer to transform a portion of the amorphous silicon layer to a superficial oxide layer (step 140). A plurality of additional processing steps are subsequently performed to form, for example, the gate, source and drain regions of a transistor. Finally, the remaining amorphous silicon layer is subject to excimer laser annealing, through which it melts and re-crystallizes to form a polysilicon layer.

The insulating substrate includes a glass substrate and a spacer layer. In the oxygen-containing plasma treatment, through which a portion of the amorphous silicon layer is transformed to the superficial oxide layer, the oxygen-containing source is excited to form plasma for surface treating the amorphous silicon layer. The oxygen-containing source includes, for example, $N_2O$ or $O_2$. When the process of the invention is implemented in a radio frequency (RF) plasma-enhanced chemical vapor deposition system, the power of the plasma is about RF 1500W. Furthermore, plasma processing is performed for about 15 seconds, which is substantially faster than the processing time, usually more than 60 seconds, needed in the prior art. Therefore, the production time and production cost are favorably reduced.

The EPCVD system used in the invention includes a radio frequency plasma-enhanced chemical vapor deposition (RF-PECVD), an electron cyclotron resonance chemical vapor deposition (ECR-CVD), a remote plasma chemical vapor The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for forming a silicon oxide, used in the production of a polysilicon film transistor, the process comprising:

providing a plasma-enhanced chemical vapor deposition (PECVD) system;

placing an insulating substrate in the PECVD system;

forming an amorphous silicon layer on the insulating substrate by PECVD; and performing an oxygen-containing plasma treatment over the substrate to transform a portion of the amorphous silicon layer to a superficial oxide layer.

2. The process of claim 1, wherein the insulating substrate includes a glass and a spacer layer.

3. The process of claim 1, wherein the surface treatment performed over the substrate to transform the portion of amorphous silicon layer to the superficial oxide layer, the oxygen-containing source is excited to form a plasma for surface treating the amorphous silicon layer.

4. The process of claim 1, wherein the oxygen-containing source includes $N_2O$ or $O_2$.

5. The process of claim 1, wherein the plasma enhanced chemical vapor deposition system is a radio frequency (RF) plasma-enhanced chemical vapor deposition system.

6. The process of claim 1, wherein the plasma enhanced chemical vapor deposition system is an electron cyclotron resonance chemical vapor deposition (ECR-CVD) system.

7. The process of claim 1, wherein the plasma enhanced chemical vapor deposition system is a remote plasma chemical vapor deposition (RPCVD) system.

8. The process of claim 1, wherein the plasma enhanced chemical vapor deposition system is a magnetic plasma chemical vapor deposition (MPCVD) system.

* * * * *